United States Patent [19]

Phillips

[11] Patent Number: 4,568,562

[45] Date of Patent: Feb. 4, 1986

[54] METHOD OF ELECTROLESS PLATING EMPLOYING PLASMA TREATMENT

[75] Inventor: Eugene Phillips, Diamond Bar, Calif.

[73] Assignee: General Dynamics, Pomona Division, Pomona, Calif.

[21] Appl. No.: 675,792

[22] Filed: Nov. 28, 1984

[51] Int. Cl.⁴ ............................................. B05D 3/06
[52] U.S. Cl. ........................................ 427/40; 427/98; 427/123; 427/125; 427/305; 427/328; 427/443.1; 427/443.2
[58] Field of Search .................. 427/40, 98, 123, 125, 427/305, 328, 443.1, 443.2

[56] References Cited

U.S. PATENT DOCUMENTS

| | | | |
|---|---|---|---|
| 4,096,043 | 6/1978 | DeAngelo | 427/98 |
| 4,151,313 | 4/1979 | Waijima | 427/98 |
| 4,232,060 | 11/1980 | Mallory, Jr. | 427/98 |
| 4,278,435 | 7/1981 | Ebneth | 8/471 |

*Primary Examiner*—Bernard D. Pianalto
*Attorney, Agent, or Firm*—Neil F. Martin; John R. Lindsay; Edward B. Johnson

[57] ABSTRACT

A method for electroless overplating of a conductive metal on printed wiring circuitry components mounted upon a plastic substrate which eliminates deposit metal overgrowth upon the plastic substrate and plastic bonding materials. The substrate and printed wiring are treated by exposure to a tetrafluoromethane plasma environment to chemically passivate, or neutralize, the plastic or adhesive substrate surface areas prior to electroless plating of the printed circuitry elements, thus preventing the establishment of catalyzing ions on the plastic or adhesive surfaces and subsequent lay down of the deposited metal thereon.

5 Claims, 3 Drawing Figures

METHOD OF ELECTROLESS PLATING EMPLOYING PLASMA TREATMENT

The government has rights to this invention pursuant to Contract No. N00024-82-C-5106 awarded by the U.S. Navy.

BACKGROUND OF THE INVENTION

The invention relates to a method of electronic wiring or circuit board preparation, and more particularly for providing flexible-film or rigid-board-supported circuitry with a solderable metal overlay confined to the circuitry surfaces.

Printed copper circuits or contacts are conventionally used in the manufacture of electronic circuit and wiring boards with the copper elements either being bonded directly to the surface during the cure of the board material, e.g. rigid boards, or in the case of flexible circuits, attached to a non-conducting plastic substrate by an acrylic adhesive. A typical flexible substrate is "Kapton", a polyimide formed from pyromellitic dianhydride. Copper circuitry of printed wiring boards tends to oxidize causing poor solderability which interferes with effective electrical interconnection of boards and their components. To overcome this, it is desirable to overplate the copper surfaces with a more durable metal to provide corrosion resistance, surface integrity, solderability and bondability to wire or pressure contacts. Overplating may be accomplished by electroplating in certain printed wiring board processes, but this cannot be done effectively when plating must be accomplished after etching. In such cases electroless plating is used, resulting in greatly improved efficiency particularly in the treatment of small components.

Applicant has found that electroless plating with nickel-boron provides a relatively pure nickel deposit (approximately 99 percent nickel and one percent boron) over the surface of copper circuitry components that is easily solderable, more ductile than nickel-phosphorous compounds, and provides a metal overplate that does not diffuse into the copper components. However, in electroless overplating of copper contacts adhesively attached to "Kapton" boards using nickel-boron, the utility of the finished board was significantly reduced or destroyed by unwanted deposit of the overplate metal upon the board and adhesive surfaces such as to cause short circuits between the circuitry elements. To prevent such deposit metal overgrowth, experiments were conducted to formulate an electroless activating solution to minimize or eliminate such deposits. Further, a method was sought to alter the substrate and adhesive surface chemistry so as to passivate, or neutralize reactive sites on the plastic areas to prevent subsequent conductive metal deposit thereon. The method disclosed herein achieves these purposes.

SUMMARY OF THE INVENTION

According to the precepts of the invention, a method of metal overplating copper circuitry mounted upon a plastic substrate has been developed which is effective in eliminating metal overgrowth deposits upon the plastic or adhesive surfaces, thus preventing short circuits between circuitry components supported upon the board. A disclosed regime of the invention achieves the foregoing results by treating the plastic board, or substrate, with circuitry components supported thereon, in a plasma environment which effects changes in the surface chemistry of the polymer, or plastic, to neutralize chemically active sites on the plastic areas. The substrate is then exposed to a particularly formulated catalyst solution to activate the copper circuitry surfaces prior to electroless metal overplating. In the described method, tetrafluoromethane gas is used to generate the plasma environment. Formulated compounds of both gold and palladium are employed for catalytic solutions, and nickel is used as the deposited metal in overplating the circuitry.

The primary object of applicant's method is to provide for improved electroless overplating of a conductive metal on circuitry supported upon plastic substrates without overgrowth of the deposited metal on the plastic areas. The method can be employed using available equipment and materials and under relatively easily maintained environmental conditions. The method provides for relatively rapid production of components and permits the deposit of controlled amounts of overplating metal. These and other advantages of the present invention will be apparent from the following detailed description of the invention considered in conjunction with the drawings in which:

DETAILED DESCRIPTION OF THE INVENTION

Figure 1:
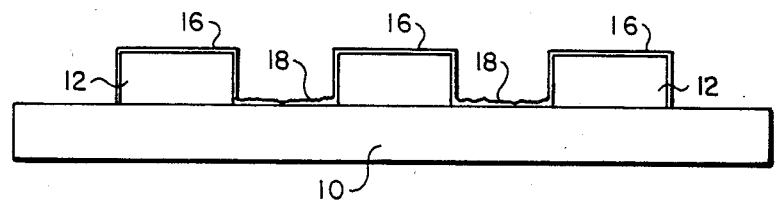
FIG. 1 is an elevation view of a representative rigid substrate illustrating undesired electroless plating overgrowth between circuitry components.
Figure 2:
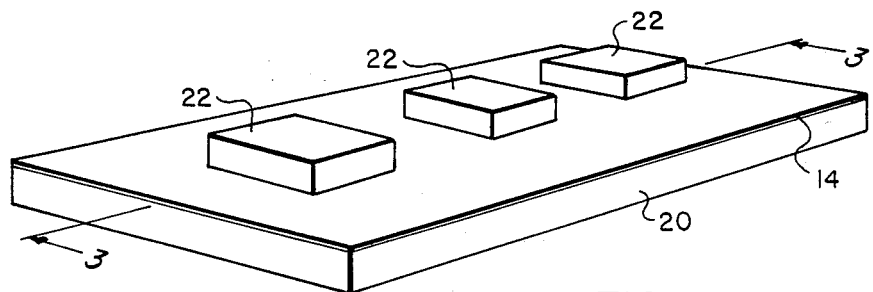
FIG. 2 is a perspective view of a representative flexible substrate with circuitry pads to be overplated adhesively mounted thereon.
Figure 3:
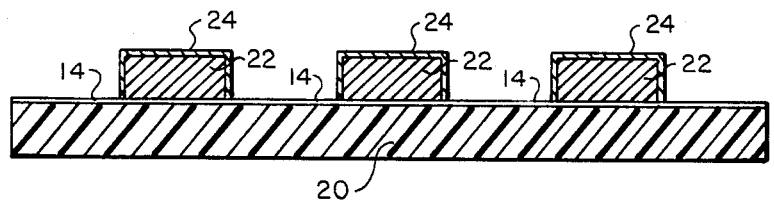
FIG. 3 is a sectional view taken on line 3—3 of FIG. 2 illustrating the substrate and circuitry components with the desired overplating.

FIG. 1 illustrates a representative rigid circuit or wiring board substrate 10 having circuitry pads 12 bonded thereon and which have been overplated with conductive metal 16 without the benefit of applicant's method resulting in deposit metal overgrowth 18 shorting the pads. FIG. 2 illustrates a representative flexible wiring or circuit board substrate 20 which is usually formed of "Kapton", a polyimide plastic film, overcoated with a layer of adhesive 14. For the purposes of this description, attached to the board 20 are representative copper electrical contact pads 22 which are secured to the substrate 20 by the acrylic adhesive illustrated by the layer 14. In order to employ the contact pads 22 most effectively as electrical junctions, it is desirable to overplate them with a conductive metal layer 24, as illustrated in FIG. 3, to facilitate the connection to them of wiring, pressure contacts, and the like. It is essential to confine the overplating to the surface of the pads 22 and prevent overgrowth deposits between the pads 22 which can result in short-circuiting the pads. Because of its utility, particularly with small components, electroless plating is employed, but other plating methods could be used. In the described regimes, nickel-boron electroless plating is employed to provide a relatively pure nickel deposit which is easily solderable and ductile, and does not diffuse into the copper pads 22. In addition, the overplating process operates at a relatively low temperature of 150° to 160° Fahrenheit.

To prevent overplating, various electroless activating solutions were formulated and evaluated using palladium and gold compounds as the catalyst component.

Activators based upon gold catalysts were found to produce significantly less overgrowth than those using palladium. The best formulation was determined by experiment to be a solution of 0.02 percent chloroauric acid and one volume percent of hydrochloric acid. To further reduce deposit overgrowth, the surface chemistry of the plastic substrate 10 and the adhesive 14 is subjected to fluoropassivation to neutralize the chemically reactive sites on the plastic areas so they will not retain ions of the gold or palladium catalysts. This is accomplished by pre-reacting the sites with a noncatalytic element before they are exposed to the catalytic ions. By exposing the circuit board to a tetrafluoromethane plasma a reactive free radical of fluorine is generated which alters the surface properties of the polymer materials. The surfaces so treated become less chemically active and also become hydrophobic. The fluoropassivation step is accomplished with the tetrafluoromethane plasma in a "Branson 4000" plasma system. The system employed in the examples described has an eight-inch diameter by fourteen-inch length quartz reactor chamber equipped with electrodes to supply radio frequency energy to generate the plasma within the chamber. The boards are treated in the chamber with process parameters shown in Table 1.

TABLE 1

| Working Gas | Tetrafluoromethane ($CF_4$) |
|---|---|
| Gas Pressure | 20 microns Hg |
| Background Pressure | 20 microns Hg |
| Power | 110 watts for 9 square inches + 10 watts for each additional 9 square inches of area |
| Frequency | 13.56 kilohertz |
| Time | 12 minutes |

While this description relates to the preparation of circuit or wiring boards having deposited or adhesively attached copper circuitry supported thereon, the method of the invention is suitable for use whenever it is desired to catalyze a metal surface, particularly a copper surface, for overplating with a conductive metal such as nickel. Treatment of resists in pattern plating or in electroforming operations are also envisioned to benefit from the method of this invention. The following examples are offered to demonstrate further the disclosed regime of the invention.

EXAMPLE 1

To produce controlled samples for comparison and evaluation of the method, specimens of the boards 10 and 20 were subjected to the following regime. The specimens were given a detergent-acid cleaning using a "Lonco" bath for four minutes prior to being microetched in a twenty five percent sulfuric acid and four percent hydrogen peroxide solution for 30 seconds. The specimens were then treated in a palladium activator solution consisting of one-tenth percent solution of palladium chloride ($PdCl_2$) and 10 percent hydrochloric acid by volume for 30 sseconds before being electrolessly overplated using nickel-boron with "Shipley Niposit 468" for 20 minutes to overplate the pads 12 to a thickness of between 3.25–3.75 micrometers of nickel.

The plating time was longer than would be used in usual production by a factor of 3 or 4 times. The longer plating time was used to increase metal overgrowth severity for evaluation purposes, and resulted in extensive unwanted nickel overgrowth on the unpassivated specimen substrates and adhesive surfaces between the pads 12.

EXAMPLE 2

Specimens of the boards 10 and 20 with pads 12 and 22 supported thereon were subjected to the regime described in Example 1 except that they were first exposed to a tetrafluoromethane plasma environment in accordance with the parameters of Table 1. The plasma fluoropassivation resulted in the electroless plated specimen nickel overgrowth on the substrate and adhesive surface being nearly eliminated.

EXAMPLE 3

As in Example 2, specimens of the boards 10 and 20 with the pads 12 and 22 supported thereon were given an initial plasma fluoropassivation treatment in accordance with the parameters of Table 1. A solution of 0.02 percent chloroauric acid and 1 percent hydrochloric acid was used as catalytic activator instead of the palladium activator of Example 2. All other steps of the method remained the same. The combination of fluoropassivation and the use of a gold activator resulted in nickel overgrowth on the specimen substrate and adhesive surfaces being eliminated.

Having described my invention, I claim:

1. A method for preparing a plastic electronic circuit board having a circuitry pattern supported thereon, comprising the steps of:
   treating the board in a plasma environment to neutralize the chemically reactive sites in plastic surface areas,
   activating the circuit pattern in a catalyzing agent solution, and
   electrolessly overplating the circuit pattern with a conductive metal,
   whereby said treating and activating steps limit said overplating to the circuitry pattern.

2. The method of claim 1 wherein:
   said treating step includes exposing the circuit board to a fluoroalkane plasma.

3. The method of claim 2 wherein:
   said fluoroalkane environment comprises a tetrafluoromethane gas plasma.

4. The method of claim 1 wherein said activating step includes:
   immersing the circuit board in a solution of 0.02 percent chlorauric acid and 1 percent hydrochloric acid by volume.

5. The method of claim 1 wherein said overplating step includes:
   electroless plating with nickel-boron.

* * * * *